United States Patent [19]
Warren

[11] Patent Number: 6,036,821
[45] Date of Patent: Mar. 14, 2000

[54] ENHANCED COLLIMATED SPUTTERING APPARATUS AND ITS METHOD OF USE

[75] Inventor: Ronald A. Warren, Essex Junction, Vt.

[73] Assignee: International Business Machines Corporation, Armonk, N.Y.

[21] Appl. No.: 09/015,703

[22] Filed: Jan. 29, 1998

[51] Int. Cl.[7] .................................................. C23C 14/34
[52] U.S. Cl. .............................. 204/192.12; 204/192.13;
  204/192.3; 204/192.32; 204/192.23; 204/192.25;
  204/298.03; 204/298.09; 204/298.11; 204/298.15;
  204/298.25; 204/298.26; 204/298.27; 204/298.28;
  204/298.31; 204/298.32; 204/298.35; 204/298.29
[58] Field of Search .................. 204/192.12, 192.13,
  204/192.3, 192.32, 192.33, 298.03, 298.09,
  298.11, 298.15, 298.25–298.28, 298.31,
  298.32, 298.35, 192.25, 298.29

[56] References Cited

U.S. PATENT DOCUMENTS

| | | |
|---|---|---|
| 4,824,544 | 4/1989 | Mikalesen et al. . |
| 4,901,667 | 2/1990 | Suzuki et al. . |
| 5,007,372 | 4/1991 | Hattori et al. . |
| 5,223,108 | 6/1993 | Hurwitt . |
| 5,382,339 | 1/1995 | Aranovich .......................... 204/192.12 |
| 5,393,398 | 2/1995 | Sugano ............................... 204/298.11 |
| 5,409,587 | 4/1995 | Sandhu et al. . |
| 5,505,833 | 4/1996 | Werner et al. . |
| 5,624,536 | 4/1997 | Wada et al. ........................ 204/298.11 |
| 5,643,428 | 7/1997 | Krivokapic et al. . |

FOREIGN PATENT DOCUMENTS

| | | |
|---|---|---|
| 1-222045 | 9/1989 | Japan . |
| 4176863 | 6/1992 | Japan . |
| 7-316808 | 12/1995 | Japan . |

*Primary Examiner*—Alan Diamond
*Attorney, Agent, or Firm*—Whitham, Curtis & Whitham; James M. Leas

[57] ABSTRACT

A sputtering apparatus using a collimator disposed between a wafer holder for holding a wafer and a target to intercept some of the particles ejected from the target, wherein the collimator is movable in a direction parallel to the wafer surface in a manner permitting the collimator to be cleaned and maintained in situ simultaneous with sputtering deposition processing.

29 Claims, 9 Drawing Sheets

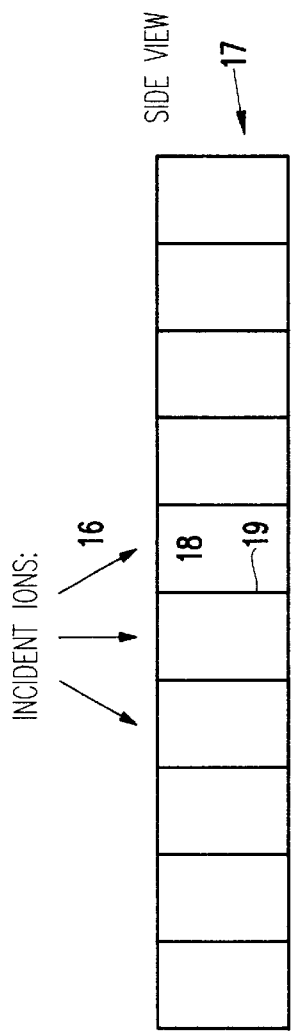
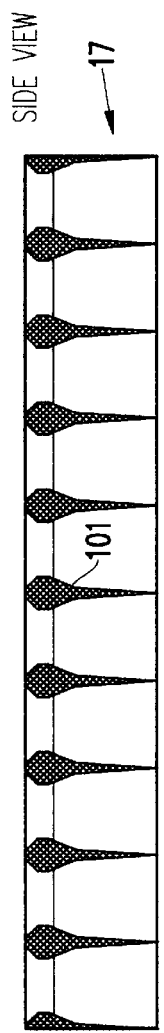
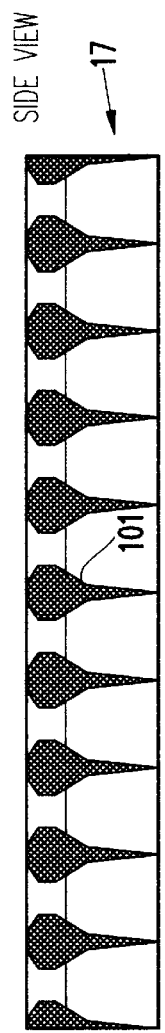
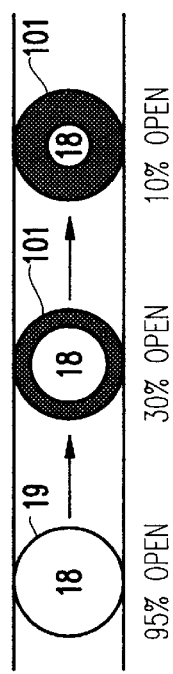
FIG. 1E PRIOR ART
FIG. 1F PRIOR ART
FIG. 1G PRIOR ART
FIG. 1H PRIOR ART

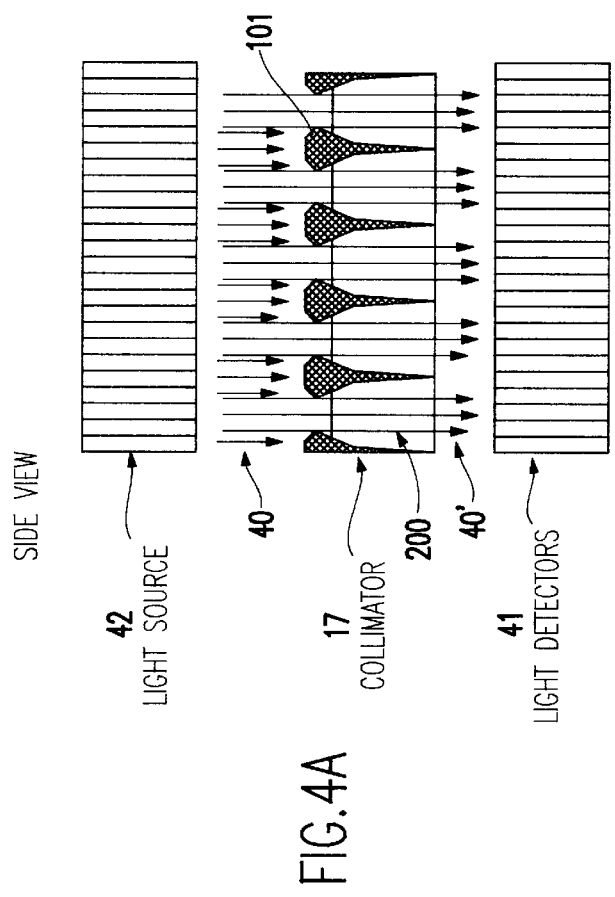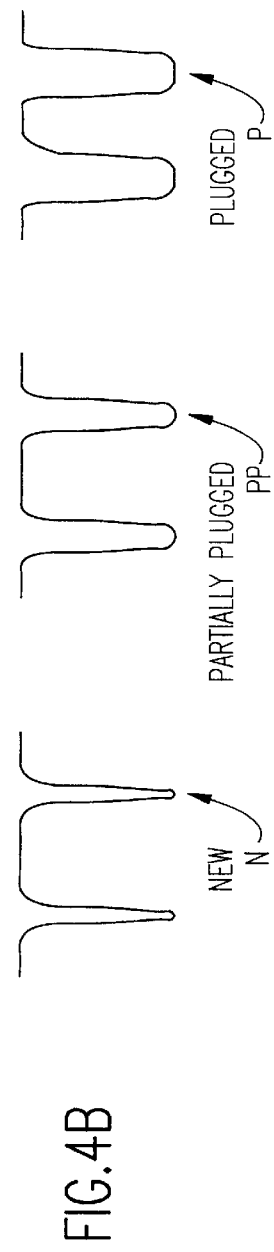

ENHANCED COLLIMATED SPUTTERING APPARATUS AND ITS METHOD OF USE

BACKGROUND OF THE INVENTION

1. Field of the Invention

The present invention generally relates to a sputtering apparatus and its method of use for forming thin films in fabrication of thin film semiconductor devices.

2. Description of the Related Art

Sputtering is used to deposit thin metal and insulating films onto semiconductor wafers. As shown in FIG. 1A, a prior art magnetron sputtering apparatus 10 generally includes a vacuum chamber 11 housing a target plate 12 mounted on a cathode 15, in which the target 12 contains the metal or other material to be deposited. The target 12 is placed in a plane parallel to a substrate wafer 13 mounted on a wafer holder 14, which is the anode. The cathode 15 is connected to power supply (not shown). An inert ionizable gas, such as argon, is introduced into the vacuum chamber 11 as indicated in FIG. 1A. A plasma is generated between the electrodes (14, 15), and a bias is applied between the electrodes (14, 15) to draw the ionized gas atoms to the target 13. The ionized gas atoms bombard the target 12. As a result of the impact of the ions, a physical erosion mechanism occurs in which atoms are dislodged from the surface 12a of a target material. The dislodged particles settle on exposed surfaces inside the chamber 11, including the surface 13a of the wafer 13 mounted opposite the target 12, where they bond to the wafer surface 13a.

The sputtered particles 16 are ejected from the target surface 12a in scattered directions including trajectories that are substantially perpendicular as well as those that are oblique to the wafer surface as indicated by the arrows in FIG. 1A. The scattered trajectories 16 of the sputtered particles can create a problem in sputter processing for contacting and completely covering the bottom surfaces of via holes or other non-planar features of a wafer surface, especially in the context of filling high aspect contact holes and vias with contact and barrier metal layers. The aspect ratio is the ratio of the depth to diameter of the surface feature. The accumulation of sputtered material on the side walls of a feature, such as a via hole, prematurely closes off access to the bottom surface of the feature before it is entirely coated.

As a counter-measure to this problem, sputtering systems have positioned a collimator 17 between the target surface 12a and the wafer surface 13a to be processed. The collimator 17 has a plurality of closely packed, substantially parallel passages or unit cells 18 formed through the thickness of a solid grid or plate forming walls 19 bounding the passages 18. For instance, as illustrated in FIGS. 1B and 1C, the collimator 17 can have a honeycomb structure made of sheet metal. The passages 18 have a suitable length to diameter ratio (i.e., the collimator aspect ratio) such that the angle θ delimited from one point on one end of a passage to another point on the opposite side of the opening end of the same passageway will define the maximum trajectory angle that a particle could have without striking the collimator 17. As can be better seen in FIG. 1D, the collimator 17 functions as a filter of sorts to effectively permit only the sputtered particles 16 within a given range of trajectories to pass through the effective open area of one of its passages 18 and deposit upon the wafer surface 13a.

As illustrated in FIGS. 1E–1H, during sputtering, sputtered particles accumulate on exposed surfaces of the collimator 17, among other exposed surfaces within vacuum chamber 11, leading to a build-up 101 on the walls 19 bounding the passages 18. FIGS. 1F–1H show the result of the ions that hit the collimator 17 and stick to it. They do not possess enough energy to migrate/diffuse to other areas, and stay where they hit the collimator 17. This causes deposited material 101 to build up on the collimator and reduce the cross sectional area of the passages 18. As FIGS. 1F–1H show, this is especially bad because the collimator openings are generally hexagonal or circular, and hole closure consequently occurs in two dimensions. For instance, a 10 percent decrease in hole diameter of passage 18 results in a decrease in transmission of 19 percent, a 20 percent decrease in hole diameter results in a 36 percent transmission decrease. The greatest accumulation of intercepted ions at the collimator 17 tends to occur adjacent the target side, or entrance, of the collimator passages 18. This accumulation reduces the effective open area of the passages (unit cells) 18. For example, FIG. 1E shows the clean original collimator, while FIGS. 1F and 1G show progressively greater build-up 101 to leave only 30–50% and <10% open area, respectively, in cell 18 as the collimator's service life progresses. FIG. 1H is a top view of cell 18 at the various stages of use depicted in FIGS. 1E–1G.

As result of such build-up 101 on the collimator 17, the deposition rate of sputtered particles onto the wafer 13 decreases over time requiring longer deposition times to compensate for the diminishing transmission such that the collimator 17 must be periodically cleaned or even replaced to restore acceptable deposition rates and/or uniformity. Also, the passageways 18 of the collimators tended to fill and clog up unevenly, resulting in the need to shorten processing times between cleaning cycles or replace the collimator before it was fully used.

Another problem associated with the build-up 101 is that the molecules blocked by the collimator 17 transfer their kinetic and thermal energy to the collimator 17. This causes the collimator to heat-up. The collimator 17 will then radiate heat to the substrate 13, which can adversely affect the properties of the deposited film. Substrate cooling may not be adequate to protect the substrate from thermal damage by collimator radiation. If this is the case, then the sputter power must be decreased, which increases deposition times and costs. Irregular heating of the collimator can also cause particulate formation, because of flaking off of deposited material from the collimator surface. The present inventors are unaware of any conventional technique available to cool a collimator in service without interrupting processing.

Yet another problem with prior collimator designs has been that it has not been possible to measure the extent of passageway blockage or build-up without stopping processing to access the collimator for an inspection. Yet another problem associated with conventional collimator arrangements has been the difficulty, if not impossibility, in measuring or controlling collimator temperature without interrupting production in order to run cooling gases through the chamber. That mode of cooling the collimator off-line also contributed to reductions in tool throughput and could prove inadequate, especially if the collimator temperature rose above desired levels during a single deposition.

The overall down time incurred due to the frequent cleaning maintenance and/or collimator cooling required of prior collimator designs has represented substantial lost production time (i.e., reduced wafer throughput) during tool downtimes and increased maintenance costs, In any event, despite such prior efforts, the service lifetime of the prior collimators still is often considerably less than that of the sputter targets used in semiconductor processing, to further increase down time and processing disruptions.

Efforts to reduce the down times and concomitant losses in productivity associated with servicing collimators have included cleaning the collimator without breaking the vacuum in the chamber, such as proposed in the prior collimator design of U.S. Pat. No. 5,409,587. U.S. Pat. No. 5,393,398 teaches a magnetron sputtering apparatus using a target of a diameter no smaller than that of the wafer and not greater than 1.4 times that of the wafer in order to increase the proportion of sputtered particles reaching the wafer perpendicularly and reduce build-up at the collimator passageways. U.S. Pat. No. 5,393,398 also teaches use of a particle interceptor capable of being rotated so that the shadow of the particle interceptor changes continuously relative to the surface of the wafer. Japanese published application no. 07-316808 teaches rotating the collimator in conjunction with use of a mechanism to vibrate the rotational drive shaft of the collimator in a direction parallel to the substrate. U.S. Pat. No. 5,643,428 teaches use of a multi-tiered collimator system to reduce localized build-up. As other prior approaches to reducing the rate of build-up in collimator passageways, U.S. Pat. No. 5,223,108 teaches using tapered collimator passageways, while U.S. Pat. No. 5,223,108 teaches using a collimator having an array of passageways of varied diameters such that the hole radii are smaller in regions having a higher vertical flux component than in regions having lower vertical flux components.

However, prior to the present invention, the semiconductor industry still had need for a collimator cleaning/servicing arrangement which could be executed without requiring that the wafer processing operations be temporarily halted.

SUMMARY OF THE INVENTION

The present invention relates to a sputtering apparatus using a collimator disposed between a wafer holder for holding a wafer and a target to intercept some of the particles ejected from the target, wherein the collimator is movable in a direction parallel to the wafer surface in a manner permitting the collimator to be cleaned and maintained in situ simultaneous with sputtering deposition processing.

In one embodiment of the present invention, the collimator is laterally displaced a sufficient distance during sputter processing such that the same passageways or unit cells in the collimator are repeatedly moved to-and-from (i) a first location, i.e., the sputter processing region, defined in-between the target and wafer surfaces to intercept particles, and (ii) a second location situated laterally outside the processing region where the collimator passageways can traverse maintenance and/or monitoring stations before being moved back to the sputter processing region. The requisite lateral displacement of the collimator needed to displace the collimator passageways in the aforesaid manner can be effected via rotation or reciprocal movement of a suitably sized collimator relative to the target and wafer.

In one specific embodiment of the present invention, the collimator is moved in a plane parallel to the wafer surface by driving means which drives the collimator in rotation about an axis oriented substantially perpendicular to the planes of the target surface and wafer surface, in which the same passageways or unit cells in the collimator are repeatedly moved along a complete path of rotation to-and-from the sputter processing region defined in-between the target and wafer surfaces to intercept sputtered particles, to a location(s) situated laterally outside the sputter processing region where the collimator passageways traverse maintenance and/or monitoring stations before being brought back to the sputter processing region.

In another specific embodiment of the present invention, the collimator is moved in a plane parallel to the wafer surface by oscillation along a reciprocal line of motion to traverse back-and-forth between a sputter processing region defined between the wafer surface and target surface, and a location(s) outside the sputter processing region where cleaning, cooling, temperature measuring, and/or hole size measuring stations, and the like, are situated to monitor and service the collimator.

In a further embodiment, the present invention enables on-line cooling of the collimator to be performed by integral active cooling means provided within the collimator matrix itself allowing for a flowable cooling medium to be conducted throughout the collimator matrix for heat exchange and heat dissipation therefrom. Alternatively, or in addition thereto, supplemental cooling means can be stationed outside the sputtering region in the sputtering chamber to blow cooling fluids against the exterior of the collimator. The provision of active cooling lines placed within the collimator matrix, in particular, significantly improves the temperature control of the collimator.

The collimator arrangements of the present invention allow the collimator passageways to be monitored and cleaned as necessary during sputtering deposition without the need to break the vacuum in the processing chamber and without the need to discontinue sputter deposition processing while the collimator inspection and maintenance is performed. As a consequence, the amount of downtime of the sputtering tool needed for collimator maintenance is dramatically reduced to significantly improve productivity. Also, the invention permits real-time process diagnostics and process control.

BRIEF DESCRIPTION OF THE DRAWINGS

The foregoing and other objects, aspects and advantages will be better understood from the following detailed description of the preferred embodiments of the invention with reference to the drawings, in which:

FIGS. 1E–G are enlarged schematical sectional views of a prior art collimator as it progressively accumulates build-up of sputtered material. FIG. 1H is an enlarged top view of a collimator cell at the various stages of the service period of the collimator corresponding to the depictions of FIGS. 1E–1G, respectively.

FIG. 4A illustrates a hole monitoring system of this invention for measuring collimator cell clogging as a function of light intensity measurements.

FIG. 4B shows representations of the light intensity measurements made with the system depicted in FIG. 4A at varied collimator plugging amounts.

DETAILED DESCRIPTION OF THE PREFERRED EMBODIMENTS OF THE INVENTION

Figure 3:
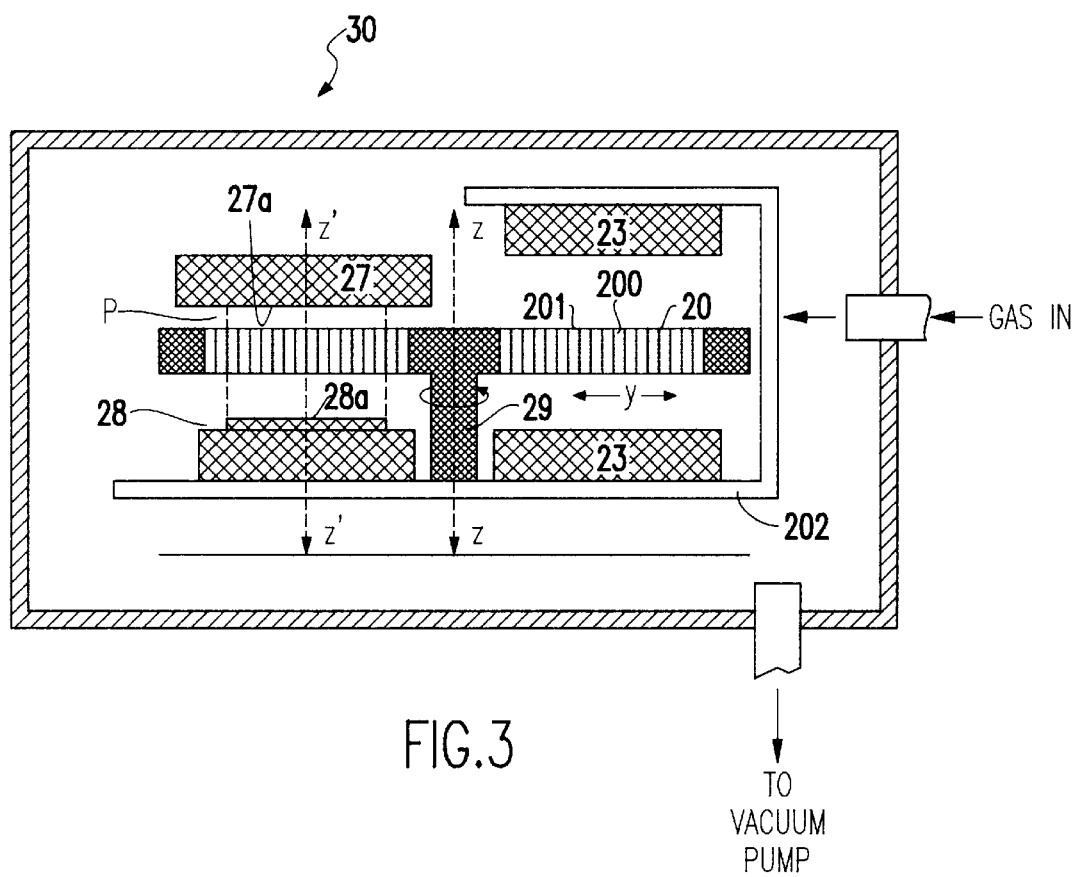
FIG. 3 is a side view taken along direction A—A of FIG. 2.

Referring now to the drawings, and particularly to FIG. 3, as one embodiment of the present invention, the collimator 20 is moved in a plane parallel to the wafer surface 28a by driving means including drive shaft or hub 29 which drives the collimator 20 in rotation about an axis z oriented substantially perpendicular to the planes of the target surface 27a and wafer surface 28a. As shown in FIG. 3, the same passageways or unit cells 200 in the collimator 20 are repeatedly moved along a complete path of rotation to-and-from a sputter processing region P defined in-between the target surface 27a and wafer surface 28a to intercept sputtered particles, to a location(s) situated laterally outside the processing region where the collimator passageways 200 sequentially traverse several different maintenance and/or monitoring stations before being brought back to the processing region. This operation is transacted without the need to break the vacuum inside a vacuum chamber 30 housing the aforesaid inventive arrangement of equipment. The boundaries of the sputter processing region P are defined by the indicated imaginary lines on its lateral sides and by the target surface 27a and wafer surface 28a on the top and bottom, respectively.

Preferably, the collimator 20 is a unitary article presenting a grid-like structure, with a plurality of substantially parallel passageways 200 each bounded by solid cell walls 201, as seen in FIG. 3. The cross-sectional shape of the passageways 200 is not particularly limited, and can be circular, hexagonal, square, or other shapes.

As a practical example of this embodiment, a rotatable collimator 20 having a 24 inch (61 cm) diameter would be used in conjunction with a target 27 having a diameter no more than one-half the size of the collimator, and the collimator would have its center of rotation revolve around axis z located 12 inches (30.5 cm), or more, laterally displaced from the central axis z' of the target surface 27a and wafer surface 28a. This arrangement enables a number of advantages to be realized. The diameter of the collimator and the amount of lateral displacement of its center of rotation z relative to the target central axis z' should be selected to ensure that the wafer surface 28a is covered by the collimator across the entire surface area 28a of the wafer 28. in the exemplary collimator and target dimensions given above, there would be four times as much collimator surface area, so the collimator has a service lifetime approximately four times longer than a conventional static collimator positioned between the target and wafer surfaces, before needing replacement.

Figure 1A:
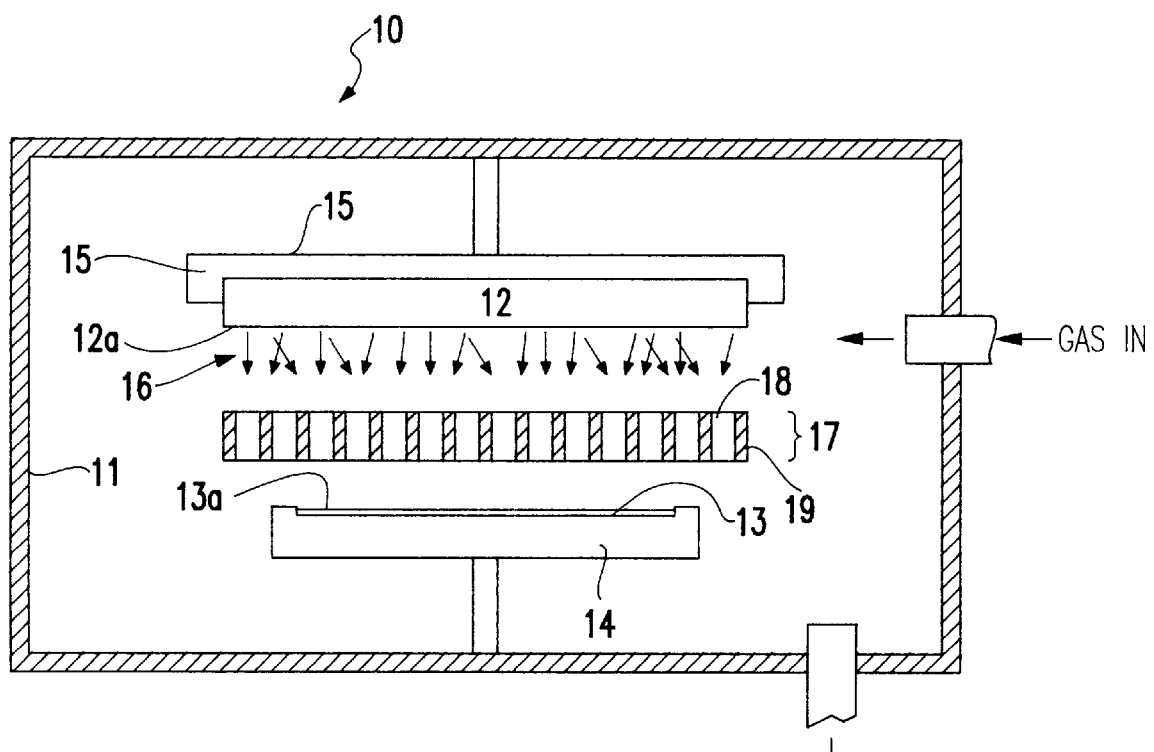
FIG. 1A is a cross sectional view of a prior art magnetron sputtering apparatus.
Figures 1B, 1C:
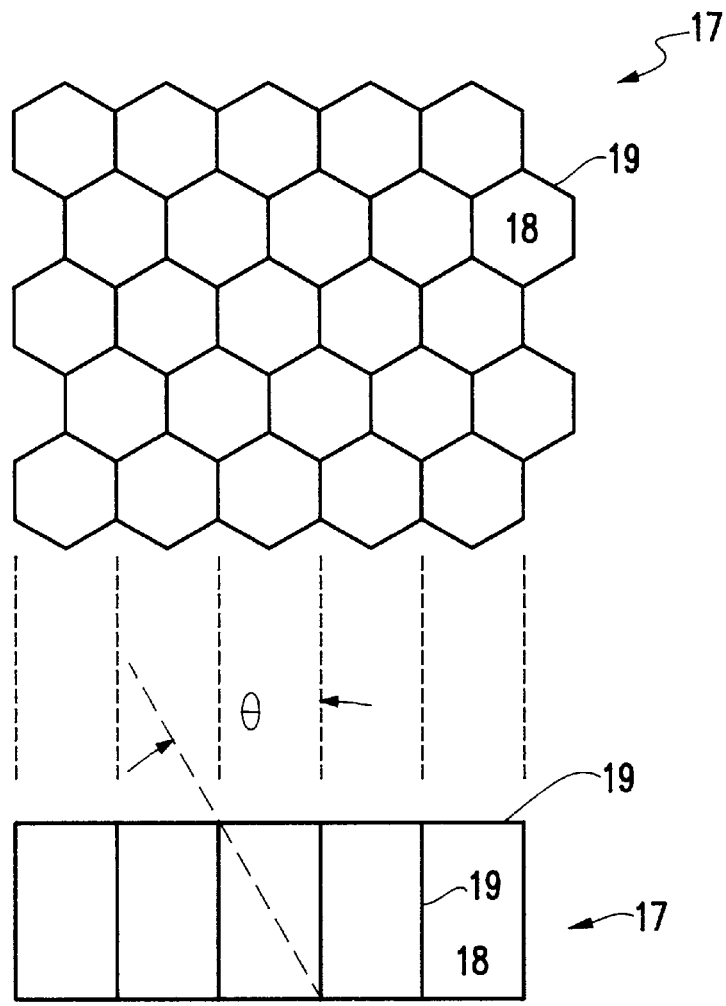
FIGS. 1B–1C is a top view and its corresponding side sectional view, respectively, for a prior art honeycomb shaped collimator design.
Figure 1D:
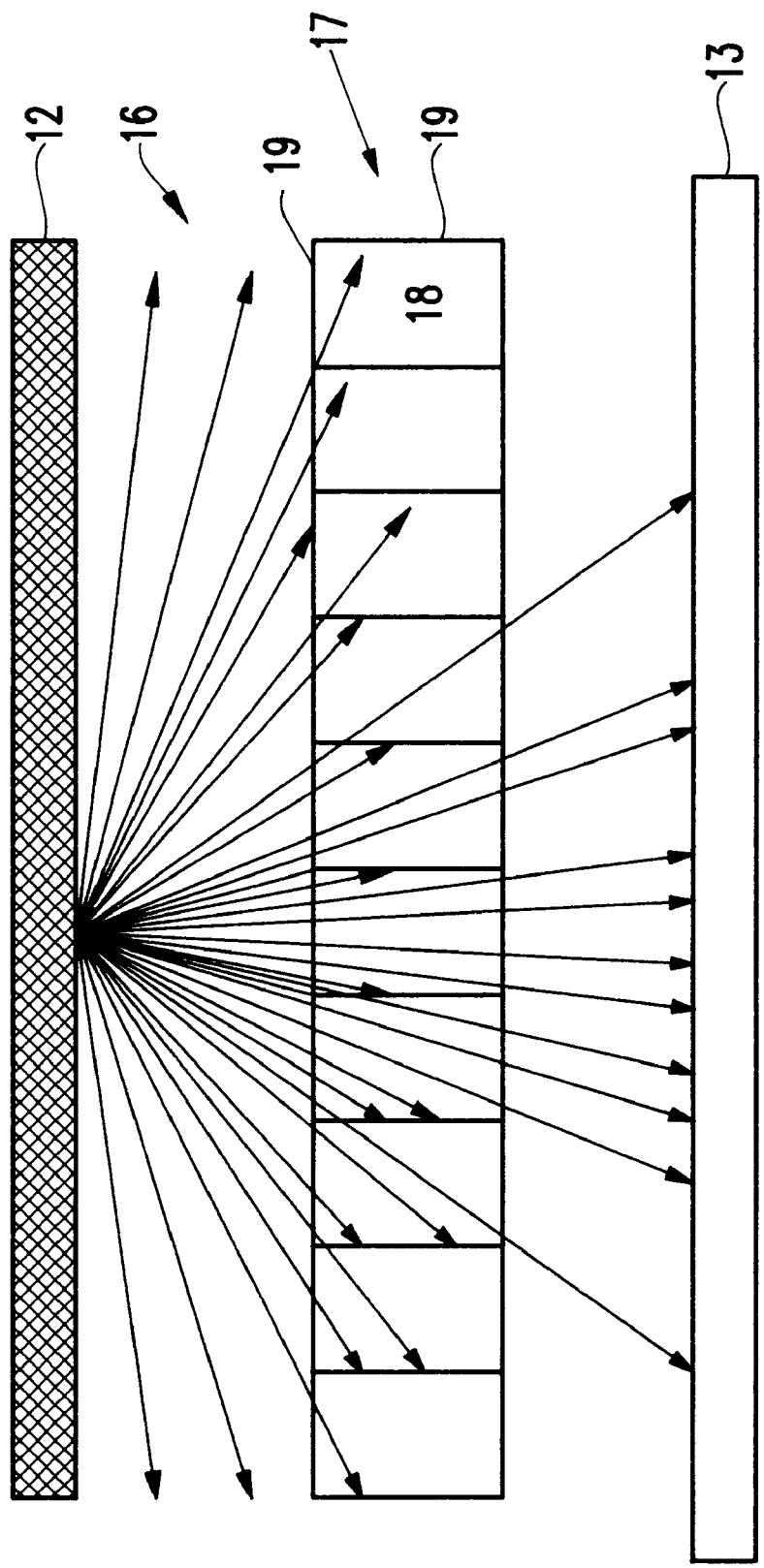
FIG. 1D is an enlarged schematical sectional view of a prior art sputtering region showing the interaction of a collimator and the array of sputtered particles.
Figure 2:
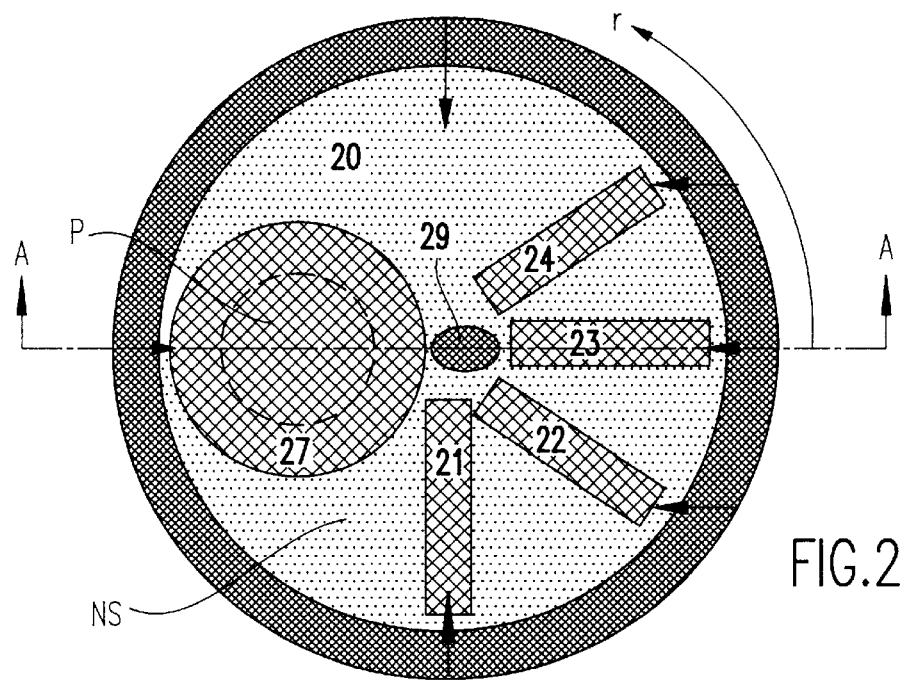
FIG. 2 is a top view of one embodiment of a movable collimator configuration of the present invention for a sputtering apparatus with rotary displacement of the collimator.

With reference to FIG. 2, the opening size measurement for the collimator passageways 200 shown in FIG. 3 can be accomplished at station 21; pyrometer/temperature sensing can be done at station 22; cooling done at station 23; and cleaning done at station 24. These operations are executed sequentially in any convenient order before the inspected and serviced passageways in the collimator 20 are returned in rotational direction "r" back to the sputter processing region P, and then the procedure is repeated continually for the duration of the sputtering operation. A support frame/bracket 202 for the equipment is shown in FIG. 3. Diagnostic information acquired by monitors 21 and 22 can be integrated into process control to advantageously be used to modify deposition rates, collimator movement, cooling medium flow rates, collimator replacement schedule, deposition times, etching times, collimator rotation or travel speed, collimator oscillation amount, and so forth.

Also, more generally, temperature excursions of the collimator 20 are minimized, because only a partial, non-predominant fraction of the collimator passageways 200 are exposed to sputter deposition at any given time during processing, and the remaining surface area of the collimator simultaneously located outside the processing region P, i.e., the non-sputter region NS, will be able to radiate heat away to cooled surfaces before being moved back into the sputter processing region P. Also, external cooling fluids (e.g., cooling gases) can be injected through the collimator 20 in the non-sputter region NS at station 23 to facilitate heat transfer, if necessary. That is, an operator may not want the complexity of active cooling lines, such as discussed in greater detail hereinafter, running through a collimator matrix itself. In that situation, it may be sufficient at station 23 to blow cooling fluid through inactive portions NS of the moving collimators, i.e., the regions outside and not immersed in the sputtering plasma region P. Necessary care must be taken to ensure that the pressure in the remainder of the sputter apparatus 30 is kept within desired levels. This can be done by having relatively close tolerances between cooling jets used to direct the cooling fluid at the collimator and the collimator, and by having multiple vacuum pump inlet ports on the far side of the collimator opposite the cooling fluid jets.

The temperature of the collimator 20 can be measured pyrometric or other equivalent means at station 22 without interfering with the plasma in sputter processing region P. The temperature measurements made at station 22 can be utilized in process control to govern the extent of cooling added at cooling station 23, modify sputter power, control any active cooling rate, or other parameters to maintain constant collimator temperature.

The collimator state can be assessed in the non-sputter region NS of the collimator by optical or other suitable means at station 21 to determine the extent that the holes have become plugged or clogged by build-up of intercepted sputtered particles, and whether the collimator should be cleaned at station 24, or even replaced.

As illustrated in FIG. 4A, to accomplish this, a stationary array of light beams 40 emanating from a light source 42 can be placed so that they illuminate the passageways 200 from above and shine through the collimator 17 as collimated beams 40' as the collimator rotates 17 through non-sputtering region NS. An array of stationary detectors 41, such as video camera, are placed on the other side of the collimator 17 underneath the light source 42. The array of light sources 42 and detectors 41 should be arrayed perpendicular to the direction of travel of the collimator 17. The light source array 42 and light detector array 41 could be switched in orientation. The array of detectors 41 maintain a record of collimator open area (light transmitted) and closed area (light blocked). This signal can be used to provide a real-time monitor of collimator state and detect when uneven or excessive plugging has taken place. The measurements also can be used to adjust deposition time in the sputtering region P as collimator holes become plugged to reduce the amount of deposition thickness drift over time.

Typical traces from a one-dimensional hole monitoring system such as described above are shown in FIG. 4B. FIG. 4B shows representations of various representative light intensity measurement signals made with the system depicted in FIG. 4A at varied collimator plugging amounts including a new collimator passageway N, a partially plugged passageway PP, and a plugged passageway P. The peak width is proportional to the collimator plugging amount. Light intensity is plotted on the y-axis, time/distance is plotted on the x-axis. The width of the intensity dips is directly related to the amount of collimator plugging. Supporting interpretive software routines are used in interpreting these intensity traces, and signaling to the operator of the equipment that the collimator should be replaced, the deposition time increased, the sputter power input decreased (to maintain constant collimator temperature in the passive cooling case), or the movement of the collimator modified to compensate for uneven collimator plugging.

Although not shown, a particle detection system also could be put in place in the inactive area NS in addition to the above-discusses diagnostic stations 21 and 22, to monitor and control particulate formation in practicing this invention.

The cleaning station 24 in the non-sputter region NS can be an isolated area having etchant gases introduced to selectively remove sputtered material build-up accumulated in and on the surfaces of the collimator 20. The cleaning stage 24 used in this manner to remove deposited material from the collimator allows totally uninterrupted operation. Proper design can be used to prevent migration of the etch gases into the sputter processing region P and confine the plasma density to the particular collimator areas to be cleaned. The etchant gases can be kept out of the process chamber by using a series of concentrically arranged purge gas input and vacuum exhaust output ports. This offers both diluent gas and multiple exhaust paths for the etchant precursor or product gases.

The skilled artisan would be able to select desired etching gases dependent upon the target material desired to be removed from the collimator 20. For example where the target deposited material comprises one of Al, Ti, or TiN, the effective component of the etching gas can comprise one or more of $NF_3$, $CF_4$ or $SF_6$. These gases might be introduced in pure form or as diluted with a carrier gas, such as argon or helium. The gases during cleaning can be subjected to plasma conditions such as 300 watts, a temperature of about 75 to 125° C., and etching gas feed rate of about 50 sccm for a six liter reaction chamber. Alternatively, electronic sputter cleaning also could be used to clean the collimator 20. Preferably, the cleaning operation would require only a short period of time, e.g., less than one minute.

The speed of rotation of the collimator 20 must be set slow enough to permit the cleaning and other maintenance/monitoring stations to properly perform the duties to which they are dedicated. On the other hand, if the collimator displacement speed is too slow, then cleaning will be performed too infrequently to allow the advantages of the invention to be fully realized.

In the embodiment of FIGS. 2–3, angular deposition uniformity is improved because each region of the wafer 28 will see both the collimator passageways 200 and the solid grid or walls 201, as the collimator 20 is not statically held in a single position above the wafer 28.

Figure 5:
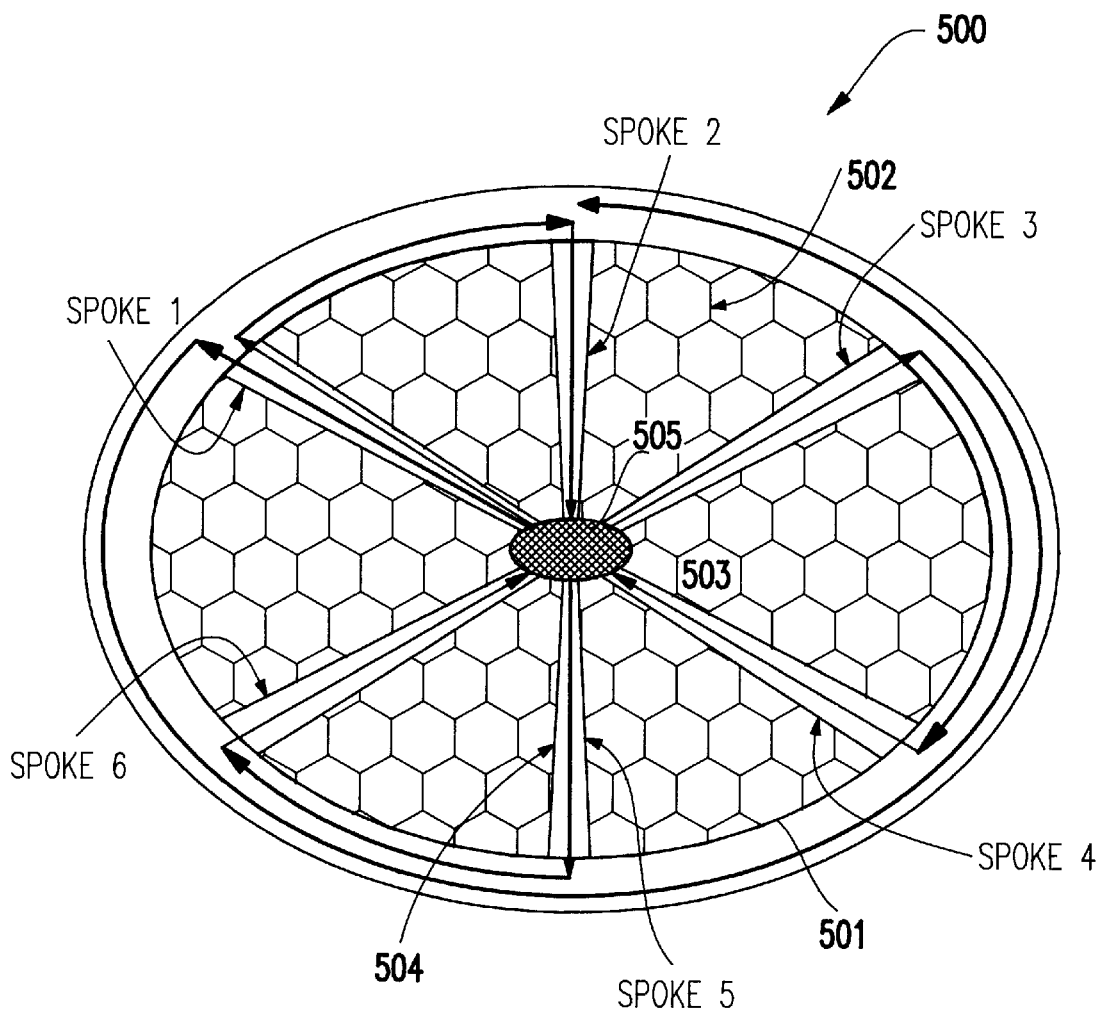
FIG. 5 is a plan view of a collimator design as in FIG. 2 involving a honeycomb cell array with an active cooling line system that can used in the practice of the invention.

As illustrated in FIG. 5, the ability to use such a relatively large collimator in this invention movable relative to the substrate in the manners described herein allows for use of active cooling lines 501, 504 within the collimator matrix 502. An example of how active cooling lines can be run through a collimator is shown in FIG. 5. As shown, the cooling line 501 is interspersed between the collimator cells 503 at an appropriate spacing. A number of cooling lines 504 that extend radially from the hub 505 to the rim 501 of the circular collimator 500. These cooling lines 501, 504 can be designed to also be the structural support for the collimator 500.

The active cooling line configuration in the collimator 500 can also be arranged so that cooling is symmetric, with each spoke having two cooling lines, one to handle flow out, the other a return line. For instance, two cooling loops could exist; the first cooling line starting at the hub 505 going out to spoke 1, goes around rim 501 to spoke 2, goes back to hub 505 in spoke 2, goes out to rim 501 at spoke 3, goes around rim 501 to spoke 4, goes back to hub 505 in spoke 4, goes out to rim 501 at spoke 5, goes around rim 501 to spoke 6, goes back to the hub 505 and out to waste or a heat exchanger. The second cooling line starts at the hub 505, goes out to spoke 1, goes all the way around the rim 501 to spoke 2, goes back to the hub 505 and out to waste or a heat exchanger. Also, the spokes 1–6 preferably should increase in width with increasing radius to maintain constant average open area. The above-discussed cooling line configurations are exemplary only, as other cooling patterns are also useable, as are a different number of spokes.

The preferred way of implementing this active cooling line configuration 500 would be to have a permanent wheel, with disposable collimator segments. Shields could be placed over the permanent parts of the collimator to allow for easy removal of deposited material. Note that these spokes should have variable cross-sectional area, so that the percentage of open area at a given radius is the same as that at all other radii. This prevents a systemic deposition rate from center to edge. If this is not done, then there will be less blockage at the outside of the wheel than the inside, which results in higher deposition amount at the outside of the collimator wheel than the inside. This can also be prevented through use of a rotating substrate, but that introduces additional mechanical complexity and potential for particulate contamination.

In the above-described embodiment using the circular collimator rotated about an axis offset from the edge of the substrate, a number benefits are realized. The collimator area is increased by a factor of 5 to 10, which decreases the average power flux to the collimator by a factor of 5 to 10; and which means that it will heat up much slower than a standard collimator; and which increases the amount of the collimator exposed to passive cooling, which allows it to maintain lower average temperature. Also, the arrangement decreases the average deposition rate on the collimator by a factor of 5 to 10, which results in the collimator lasting 5 to 10 times as long between changes. It also averages out non-uniformity of deposition on the collimator, which increases collimator lifetime and reduces maintenance costs.

Figure 6:
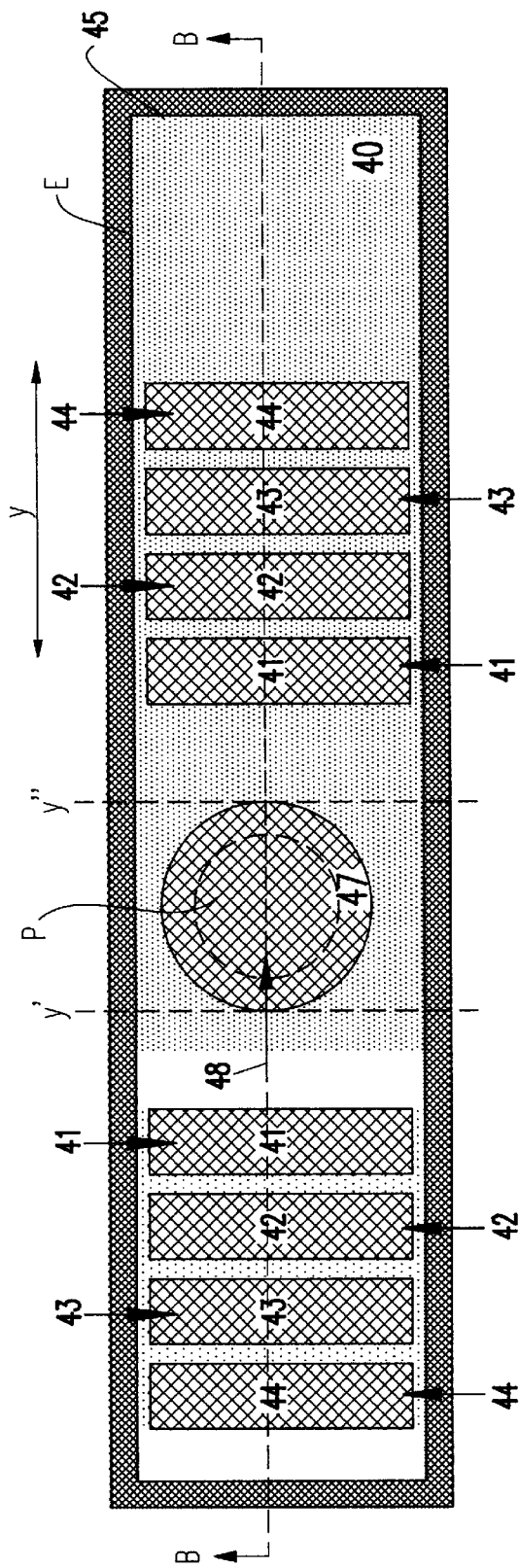
FIG. 6 is a top view of another embodiment of a movable collimator configuration of the present invention for a sputtering apparatus with reciprocating collimator displacement.

In another embodiment of the invention illustrated in FIG. 6, there is reciprocating collimator of a parallelogram-shaped surface geometry such that the collimator can simultaneously have surface area located in the sputter processing region and other surface areas located at maintenance or measuring stations located along the line of reciprocal movement and outside the sputter processing region, without leaving excessive unused areas along the side edges E of the collimator. A rectangular collimator surface area is preferable in the embodiment, although not necessarily required. In the perspective of FIG. 6, the hatched circle 49 indicates the wafer 48 (not shown) located under and within the edges of target 47.

Figure 7:
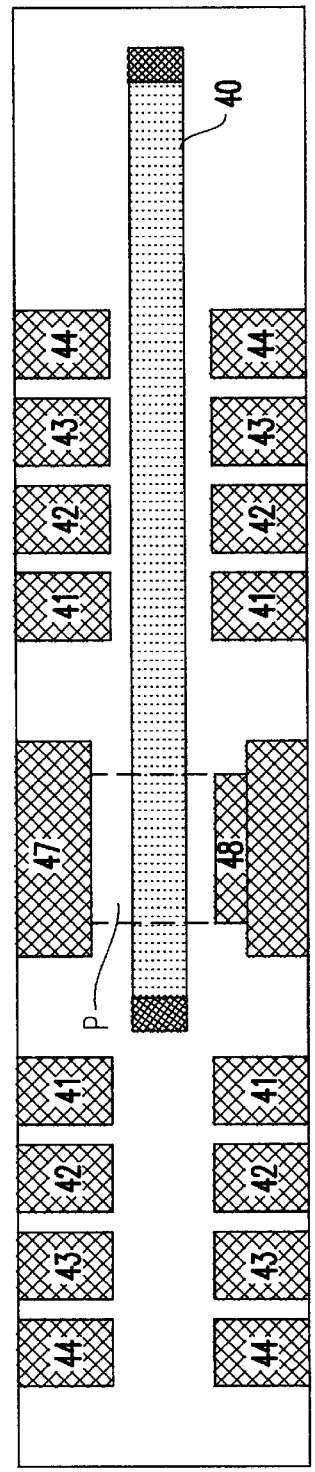
FIG. 7 is a side view taken along direction B—B of FIG. 6.

Also, in the reciprocal movement embodiment illustrated in FIGS. 6–7, it is preferable to provide the cleaning stations (44, 44'), the temperature sensing stations (42, 42'), the hole size measurement stations (41, 41'), and/or the cooling stations (43, 43') on both flanking both sides of the sputter processing region P located between sputter target 47 and wafer 48. The reason being the desirability of subjecting the sputter processing region P to collimator filtering over an entire cross-section of the region P at all times during sputter processing and so that all areas of the collimator 40 that are used in the sputter filtering process at some time in the sputter processing region P can be serviced at maintenance and monitoring stations outside the sputter processing region P.

The speed of the lateral displacement of the collimator 40 along the y-direction shown in FIG. 6 generally is the range of about 1 to about 40 inches/min (about 2.5 to about 100 cm/min). As with the first embodiment using rotation of a laterally displaced, large collimator, the speed of displacement of the collimator in the "back-and-forth" embodiment must be set slow enough to permit the cleaning and other maintenance/monitoring stations to properly perform the duties to which they are dedicated. On the other hand, if the collimator displacement speed is too slow, then cleaning will be performed too infrequently to allow the advantages of the invention to be fully realized. The mechanism used to induce the controlled reciprocative movement of the collimator can be a drive screw and motor.

In practice, when the collimator 40 is laterally shifted, in the perspective of FIG. 6, to its farthest position to the right sufficient that all regions of the collimator 40 used for sputter filtering in the prior cycle involving leftward displacement of the collimator 40 pass over and clear all of the monitoring and maintenance stations 41–44 located on the right side of the processing region P, with the proviso that the left-hand edge 46 of the collimator should not be displaced any further to the right than imaginary line y' located on the immediate left side of the processing region P to make sure that no unfiltered sputtering occurs in the processing region P. On the other hand, when the collimator is laterally shifted back in the left-hand direction to its farthest position to the left sufficient that all regions of the collimator used for sputter filtering in the prior cycle involving rightward displacement of the collimator pass over and clear all of the monitoring and maintenance stations 41'–44' located on the left side of the processing region P, with the proviso that the right-hand edge 45 of the collimator should not be displaced any further to the left than imaginary line y" located on the immediate right side of the processing region P to ensure that no unfiltered sputtering occurs in processing region P.

The back-and-forth configuration of equipment illustrated in FIGS. 6–7 would be housed within a vacuum chamber, such as illustrated in FIGS. 2–3. The pair of hole size measurement stations 41, 41'; the pair of temperature measurement stations 42, 42'; the pair of cooling stations 43, 43'; and the pair of cleaning stations 44, 44', used in the embodiment illustrated in FIGS. 6–7 can be the same types as described above for the embodiment illustrated in FIGS. 2–3. In either of the above-describe embodiments of the invention, the induced lateral displacement of surface areas of the collimator periodically to and from the sputter processing region involves bulk movement of the collimator as a whole out of the sputter processing region, and not merely localized vibrations occurring inside the sputter region.

Figure 8:
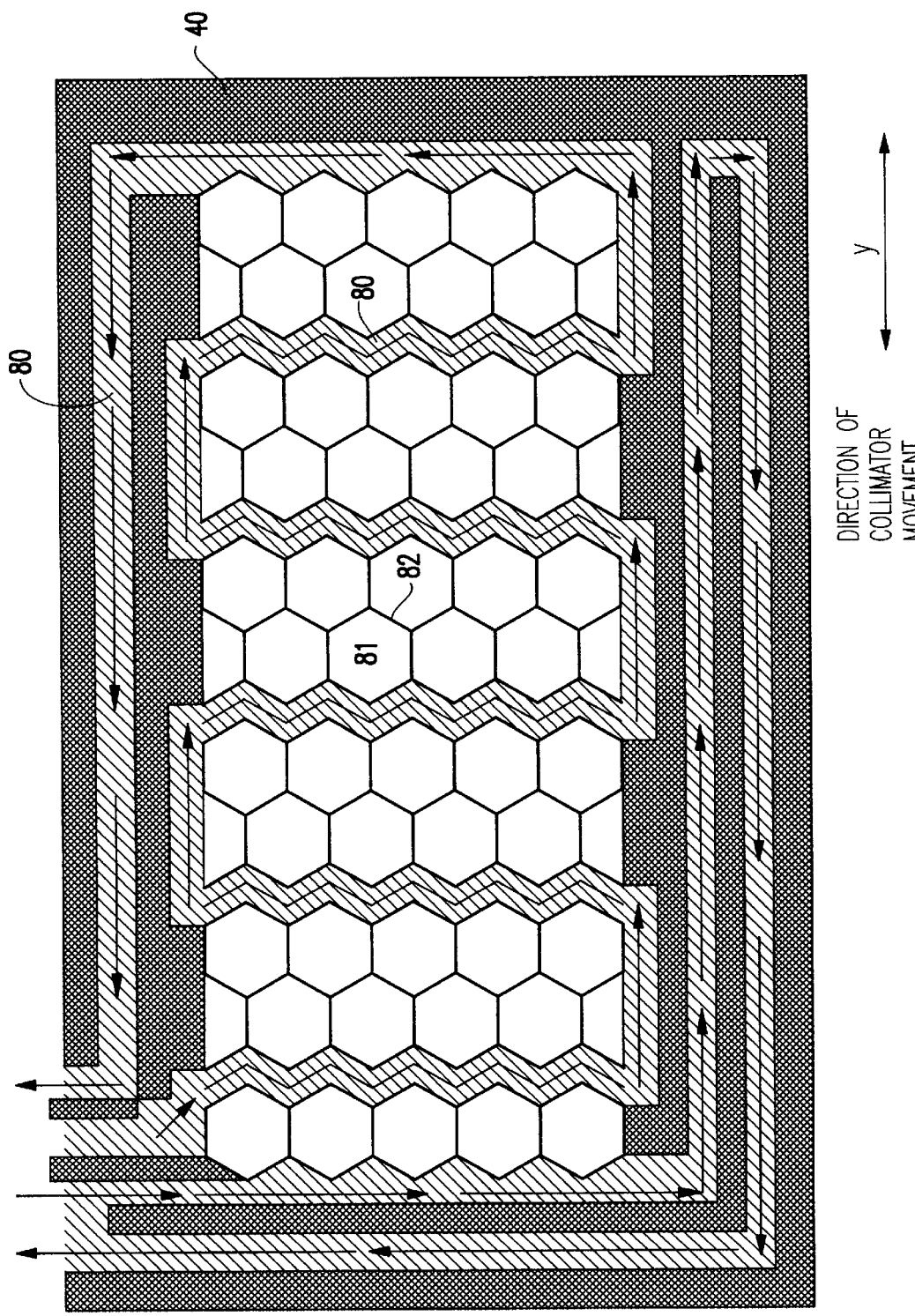
FIG. 8 is plan view of a collimator design as in FIG. 6 involving a honeycomb cell array with an active cooling line system that can used in the practice of the invention.

FIG. 8 illustrates a variation of the back-and-forth collimator embodiment in which active cooling lines 80 are included in the collimator matrix 82. The active cooling of the 'back-and-forth' collimator 40 is handled somewhat similarly to the wheel collimator 500 (See FIG. 5). Cooling lines 80 are placed within the collimator matrix 82, which run perpendicular to the direction of travel y of the collimator 40. As described previously in connection with FIG. 5, insert collimation segments and shields can be used to reduce strip times and collimator costs. The coolant flow pattern is indicated by the arrows and the representative locations of the active cooling lines in the collimator are indicated by the hatched-line areas. Although the active lines are depicted as located between every two columns of cells 81, it will be understood that the periodicity of the active lines 80 that run through the collimator array may be varied depending on a number of factors, such as the cell diameters, cooling line capacities, and so forth, as long as sufficient cooling is provided to adequately dissipate the heat-build-up in the collimator during sputter processing. The active cooling permits on-line heat dissipation so as to prevents defects in the deposition on the substrate due to collimator heat.

An advantage of the "back-and-forth" approach illustrated in FIGS. 4–5 is that it results in uniform deposition on the collimator, while the "rotating" collimator approach shown in FIGS. 2–3 will tend to have greater deposition on the area of the collimator located closer to the collimator center hub 29. Additionally, either the "back-and-forth" approach or the "rotating" approach also could be moved in another additional axis. For instance, in the back-and-forth approach, movement could be induced normal to the back-and-forth directions of motion. In the case of the rotating approach, the collimator disk could be moved so that the hub is closer or further away from the center of the target. These provisos would serve to even out deposition patterns on the collimator induced by non-symmetric target erosion, variation in ion directional flux, or by deposition nonuniformly induced by the movement mechanism itself. In either of the above-exemplified embodiments, care must be taken to ensure that parts are properly biased and shielded against undesired deposition, and that allowance is made for target support and cooling.

A further optional refinement of the invention involves providing means to induce localized lateral displacements of the collimator openings in a direction parallel to the surface of the wafer while the collimator is either rotated or reciprocated in-and-out of the sputtering region in the manners as described above. For instance, additional gearing (not shown) could be provided to induce relatively minor back-and-forth displacements of the main drive shaft 29 of the rotating collimator 20 along the y-direction indicated in FIG. 3, e.g., movement of about half the average hole spacing in the collimator 20. This provides even further reductions in the rate of shadowing in the collimator openings 200 providing for longer collimator use-times. The inducement of such minor lateral displacments of the collimator does not interfere with the hole space measuring process performed at station 21 by basing the optical meaurements on very short exposure times relative to the lateral movement induced upon the collimator.

While the invention has been described in terms of its preferred embodiments, those skilled in the art will recognize that the invention can be practiced with modification within the spirit and scope of the appended claims.

What is claimed is:

1. A sputtering apparatus for sputtering a thin film on a substrate, the substrate having a surface, the apparatus comprising:

a target and a sputter processing region between the substrate and said target;

a collimator having a first portion and a second portion connected to said first portion, said first portion located in said sputter processing region, said second portion located outside said sputter processing region, wherein said collimator includes passageways oriented substantially perpendicular to said substrate surface; and drive means to induce lateral displacement of said collimator in a direction parallel to the substrate surface, the drive means being sufficient to move said entire first portion of said collimator out of said sputter processing region and to move said second portion into said sputter processing region.

2. The sputtering apparatus of claim 1, wherein said collimator passageways traverse maintenance and/or monitoring stations outside said sputter processing region before being moved to the sputtering processing region by said drive means.

3. The sputtering apparatus of claim 1, wherein said drive means inducing said lateral displacement of said collimator is a rotary drive means.

4. The sputtering apparatus of claim 1, wherein said drive means inducing said lateral displacement of said collimator is a reciprocal drive means.

5. The sputtering apparatus of claim 1, further comprising a collimator passageway aperture-size measurement means positioned outside said sputter processing region.

6. The sputtering apparatus of claim 5, wherein said passageway aperture-size measurement means includes electro-optical sensing means.

7. The sputtering apparatus of claim 1, further comprising a collimator temperature measurement means positioned outside said sputter processing region.

8. The sputtering apparatus of claim 7, wherein said collimator temperature measurement means is a pyrometer.

9. The sputtering apparatus of claim 1, further comprising a collimator cooling means positioned outside said sputter processing region.

10. The sputtering apparatus of claim 1, further comprising a collimator passageway cleansing means positioned outside said sputter processing region.

11. The sputtering apparatus of claim 10, wherein said collimator passageway cleaning means comprises equipment capable of creating an etching plasma in the vicinity of said collimator.

12. The sputtering apparatus of claim 11, wherein said collimator passageway cleaning means comprises equipment capable of creating sputtering ions which bombard said collimator.

13. The sputtering apparatus of claim 1, wherein said collimator includes a matrix of walls defining said passageways, and said matrix walls contain active cooling lines carrying a flowing cooling medium dissipating heat from said collimator.

14. The sputtering apparatus of claim 13, further comprising process control means capable of interrupting processing to alert an operator to replace said collimator or adjusting a process parameter selected from the group consisting of sputter deposition time, sputter power input, collimator lateral displacement speed, cooling medium flow rate, temperature in cooling lines, and collimator re-positioning to compensate for any uneven collimator plugging.

15. The sputtering apparatus of claim 1, further comprising means to induce localized lateral displacements of said collimator passageways in said direction parallel to said substrate surface.

16. A sputtering apparatus for sputtering a thin film on a substrate, the substrate having a substrate surface, the apparatus comprising:

a target and a sputter processing region between the substrate and said target;

a circular collimator having a first portion and a second portion, said first portion located in said sputter processing region, said second portion located outside said sputter processing region, wherein said collimator includes passageways oriented substantially perpendicular to said substrate surface; and rotary drive means to induce rotation of said collimator, said rotary drive means being sufficient to move said entire first portion of said collimator out of said sputter processing region and to move said second portion into said sputter processing region.

17. The sputtering apparatus of claim 16, wherein said collimator has a diameter at least twice as large as the diameter of said target, and said collimator has a central axis of rotation located laterally beyond an outermost side edge of said substrate.

18. A sputtering apparatus for sputtering a thin film on a substrate, the substrate having a substrate surface, the apparatus comprising:

a target and a sputter processing region between the substrate and said target;

a collimator of parallelogram geometry having a first portion and a second portion, said first portion located in said sputter processing region, said second portion located outside said sputter processing region, wherein said collimator includes passageways oriented substantially perpendicular to said substrate surface; and a reciprocal drive means to induce back-and-forth movement of said collimator across said sputter processing region, said reciprocal drive means being sufficient to move said entire first portion of said collimator out of said sputter processing region and to move said second portion into said sputter processing region.

19. The sputtering apparatus of claim 18, further comprising a pair of maintenance and/or monitoring stations located on opposite lateral sides of said sputter processing region along a line of reciprocal movement of the collimator.

20. A method of sputtering thin film on a substrate, the substrate having a surface, the method comprising the steps of:

providing a sputtering apparatus having a target and a sputter processing region between the substrate and said target, and a collimator having a first portion and a second portion connected to said first portion, said first portion located in said sputter processing region, said second portion located outside said sputter processing region, said collimator including passageways oriented substantially perpendicular to said substrate surface;

generating a plasma gas in said sputter processing region and bombarding said target with accelerated ions from the plasma gas to eject film-forming particles from said target; and laterally displacing said collimator in a direction parallel to said surface of said substrate, the lateral displacing step moving said entire first portion of said collimator out of said sputter processing region and moving said second portion into said sputter processing region.

21. The method of claim 20, wherein said step of laterally displacing is achieved with a drive means selected from the group consisting of a rotary drive means and a reciprocating drive means.

22. The method of claim 20 further comprising the step of inspecting and/or performing maintenance on said collimator at a collimator inspection and/or maintenance station positioned outside said sputter processing region, said collimator inspection and/or maintenance station being selected from a collimator passageway aperture-size measurement means, a collimator temperature measurement means, a collimator cooling means, and a collimator passageway cleaning means, and combinations thereof.

23. The method of claim 20, further comprising the step of measuring a collimator passageway aperture-size outside said sputter processing region.

24. The method of claim 20, further comprising the step of measuring a collimator temperature outside said sputter processing region.

25. The method of claim 20, further comprising the step of cooling said collimator outside said sputter processing region.

26. The method of claim 20, further comprising the step of cleaning said collimator with an etching plasma or a region of etchant gas in the vicinity of said collimator outside said sputter processing region.

27. The method of claim 20, further comprising the step of cleaning said collimator by sputtering ions which bombard said collimator outside said sputter processing region.

28. The method of claim 20, wherein said collimator includes a matrix of walls defining said passageways, and said matrix of walls contain active cooling lines carrying a flowing cooling medium for dissipating heat from said collimator, and further comprising the step of cooling said collimator with said flowing cooling medium.

29. The method of claim 20 further comprising the step of controlling processing in said sputtering apparatus with a process control means which can control the process to perform a function selected from the group consisting of interrupting processing to alert an operator to replace said collimator, adjusting sputter deposition time, adjusting sputter power input, adjusting collimator lateral displacement speed, re-positioning said collimator to compensate for any uneven collimator plugging, adjusting cooling medium flow rate, and adjusting temperature in cooling lines.

* * * * *